United States Patent [19]

Strutt et al.

[11] Patent Number: 5,096,739
[45] Date of Patent: Mar. 17, 1992

[54] ULTRAFINE FIBER COMPOSITES AND METHOD OF MAKING THE SAME

[75] Inventors: Peter R. Strutt, Storrs, Conn.; Gan-Moog Chow, Greenbelt, Md.

[73] Assignee: The University of Connecticut, Storrs, Conn.

[21] Appl. No.: 441,163

[22] Filed: Nov. 27, 1989

[51] Int. Cl.⁵ .......................... B05D 3/06; B32B 5/02
[52] U.S. Cl. .................... 427/53.1; 428/608; 428/389
[58] Field of Search ............ 427/53.1; 428/608, 630, 428/650, 665, 389

[56] References Cited

U.S. PATENT DOCUMENTS

| | | | |
|---|---|---|---|
| 2,616,165 | 11/1952 | Brennan | 428/630 |
| 4,060,412 | 11/1977 | Divecha | 29/419.1 |
| 4,457,979 | 7/1984 | Donomoto et al. | 428/608 |
| 4,465,741 | 8/1984 | Yamatsuta et al. | 428/608 |
| 4,613,645 | 9/1986 | Robeson et al. | 524/611 |
| 4,619,691 | 10/1986 | Araya et al. | 75/345 |
| 4,649,022 | 3/1987 | Tischer et al. | 29/419.1 |
| 4,774,052 | 9/1988 | Nagle et al. | 420/129 |
| 4,816,293 | 3/1989 | Hiramoto et al. | 427/53.1 |
| 4,921,348 | 5/1990 | Yeung et al. | 356/432 |
| 4,987,007 | 1/1991 | Wagal et al. | 427/42 |

OTHER PUBLICATIONS

Bartholomew et al., "Low Temp. Syn. of High Tc Superconductor Thin Films by Laser Assisted Reactive Deposition", *High Temp Superconductors II*, pp. 81–84, Ed Capone II et al., 4/88.

*Primary Examiner*—Shrive Beck
*Assistant Examiner*—Marianne L. Padgett
*Attorney, Agent, or Firm*—Fishman, Dionne & Cantor

[57] ABSTRACT

A novel method is presented for synthesizing ultrafine fiber composite materials by laser induced coevaporation of a metallic target and a ceramic target in the presence of a heated tungsten filament, within a reducing environment. The species produced by rapid condensation from the resultant laser plume, along with the products derived from the chemical transport reactions involving the heated filament, form layers of composite material comprising a metal matrix and a random weave fiber network. In a preferred embodiment of the present invention, composite layers are formed on a nickel alloy substrate surface at a rate of about 1 micron per second. The matrix of the composite films is either aluminum or tungsten and the dispersed phase is amorphous silica fibers. The diameter of the fibers are between 25 and 120 nm depending on the laser beam materials interaction time.

18 Claims, 1 Drawing Sheet

ULTRAFINE FIBER COMPOSITES AND METHOD OF MAKING THE SAME

The Government has rights in this invention pursuant to a contract awarded by the Office of Naval Research.

BACKGROUND OF INVENTION

This invention relates generally to a method of making ultrafine fiber composites using laser assisted reactions. More particularly, this invention relates to a technique for synthesizing ultrafine fiber composites involving the condensation of metallic and nonmetallic species, produced by laser induced evaporation. An example of a composite formed using the method of this invention is an aluminum or tungsten matrix having a dispersed phase of amorphous silica fibers.

In general, composite structures are synthesized to obtain unique mechanical and other properties. This involves appropriate selection of the (1) chemical composition, (2) constituent phases, (3) morphology and (4) structural scale. Achieving the necessary degree of control, particularly in the generation of ultrafine structures, requires using recently developed techniques for the synthesis of thin-layers and small particles. For example, laser methods are frequently employed to produce thin deposited layers by radiation-assisted reactions. Some of the interesting features of the laser reactions and interactions include, (1) high intensity irradiation for rapid heating, (2) selective laser-beam and material coupling, (3) a small interaction zone resulting in localized reactions, thus minimizing contaminations, (4) high rates of chemical and physical transformations of reactants, and (5) generation of mestastable phases.

Presently, three laser-assisted mechanisms have been employed in the surface modification and material synthesis composites. These mechanisms include laser-chemical vapor deposition (LCVD), a laser-liquid reaction, and laser evaporation. The nature of laser evaporation depends upon the coupling of the beam with the material to be evaporated. A material plume is often observed in evaporation. The plume provides active vapor species that can react in a suitable environment and form desirable products which can condense to produce surface layers.

From a practical standpoint of composite synthesis, the control of microstructural scale is critically important. For example, methods leading to a drastic reduction in interfiber spacing will result in increased strength and fracture toughness. Known methods for drastically reducing microstructural scale have produced equiaxed structures as described in the paper presented by R. Birringer, V. Herr and H. Gleiter at the 1986 Fall Material Research Society Meeting (held in Boston, Mass.) wherein the synthesis of 1-100 nm particle materials resulted in unique physical and chemical properties. This prior work involved the synthesis of nanoscale powder materials by evaporation followed by rapid condensation. Conversion into bulk form was then achieved by removal from the processing chamber and powder compaction.

SUMMARY OF THE INVENTION

In accordance with the present invention, a novel method is presented for synthesizing ultrafine fiber composite materials by laser induced coevaporation of a metallic target and a ceramic target in the presence of a heated tungsten filament, within a reducing environment. The species produced by rapid condensation from the resultant laser plume, along with the products derived from the chemical transport reactions involving the heated filament, form layers of composite material comprised of a metal matrix and a random weave fiber network.

In a preferred embodiment of the present invention, composite layers are formed on a nickel alloy substrate surface at a rate of about 1 micron per second. The matrix of the composite is either aluminum or tungsten and the dispersed phased is amorphous silica fibers. The diameter of the fibers are between 25 and 120 nm depending on the laser beam materials interaction time.

The ultrafine composite synthesis method of this invention provides a rapid process for producing a diversity of ultrafine fiber-reinforced composites. In particular, the preparation of aluminum and tungsten matrix materials demonstrates the availability of this invention to produce both (1) high-strength/low weight composite layers and (2) high-strength/high temperature composite layers.

The above-discussed and other features and advantages of the present invention will be appreciated to those skilled in the art from the following detailed description and drawings.

BRIEF DESCRIPTION OF THE DRAWINGS

Referring now to the drawings, wherein like elements are numbered alike in the several FIGURES.

DESCRIPTION OF THE PREFERRED EMBODIMENT

The present invention relates to the production of composite materials having ultrafine (nanometer sized) fibers dispersed therein. The composite is synthesized in the form of a deposited layer, using laser evaporation and rapid condensation. The final composite comprises a network of nanometer scale fibers (e.g. silica) within a metal matrix (e.g., aluminum or tungsten). This is achieved by the simultaneous deposition of silica fibers and metal atoms onto a metal substrate. As will be discussed in more detail below, a novel hypothesis is presented for the mechanism involved in this invention. In accordance with this mechanism, the silica fibers form in the vapor phase by coagulation of silica particles condensed from the laser plume.

Figure 1:
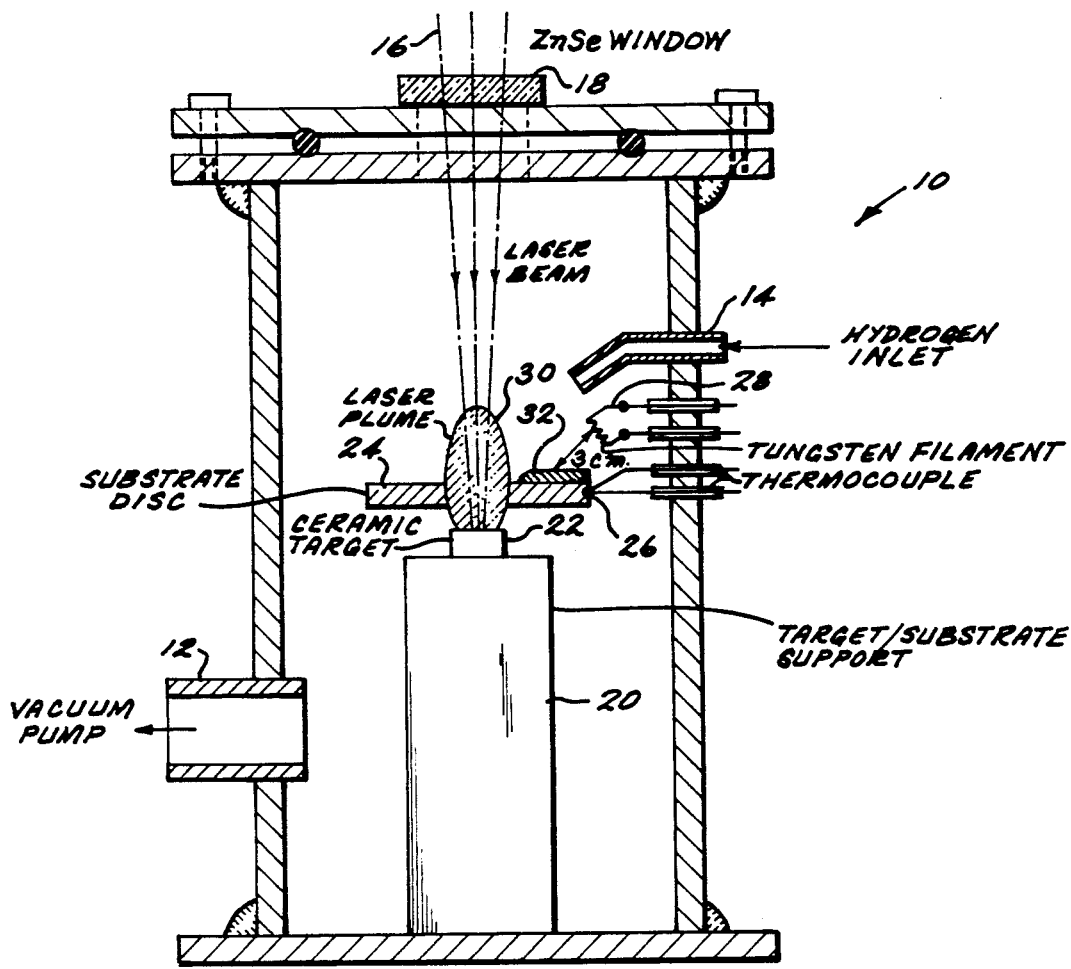
FIG. 1 is a side elevation schematic diagram of the apparatus used in the laser induced synthesis technique of the present invention.

Turning now to FIG. 1, the reaction chamber and the several components utilized in the synthesis of the present invention is shown generally at 10. Reaction chamber 10 is a standard chamber having provision 12 for evacuation by a vacuum pump (not shown). Prior to the process cycle, chamber 10 is reduced to $10^{-4}$ torr pressure, following this a hydrogen flow is maintained through hydrogen inlet 14 at 50 sccm. A high power $CO_2$ laser beam 16 enters chamber 10 through a zinc selenide window 18. The interior of chamber 10 includes a target/substrate support 20 which supports a target 22 which is preferably ceramic. Positioned above target 22 is a substrate disk 24. The temperature of substrate disk 24 is monitored using a thermocouple 26. Preferably, substrate disk 24 is comprised of a nickel aluminum alloy. Also, target/substrate support 20 is preferably a ceramic support. Spaced from substrate disk 24 is a tungsten filament 28. Tungsten filament 28 is preferably spaced about 2 cm from disk 24. As will be discussed below, this spacing is important in governing the final composite characteristics.

In FIG. 1, ceramic pedestal 20 supports the preferably ceramic target 22, while the substrate disk 24 is supported by the thermocouple wires 26. However, in a preferred embodiment, substrate disk 24 is supported entirely on a stand resting on support 20.

Still referring to FIG. 1, the laser induced ultrafine composite material and synthesis thereof utilizing co-deposition of metal and nanoscale ceramic material will now be more specifically described in the following non-limiting example.

EXAMPLE

Substrate disc 24 is a nickel alloy disk of composition (wt %) 58% Ni, 4% Al, 9% Cr, and a balance of V, Ti, Mn, Co and C is mounted above ceramic target 22. The composition of ceramic target 22 (wt %) is 55% $SiO_2$, 42% $Al_2O_3$, balance $TiO_2$, MgO and CaO. Prior to laser processing, chamber 10 is evacuated and flushed with nitrogen. Following this, and during laser irradiation a continuous flow of (mole %) 98.5% hydrogen/1.5% methane is maintained at a flow rate of 150 sccm. A 99.9% purity tungsten filament 28 in proximity to the laser beam material interaction zone or plume 30 carries a heating current which is switched on 15 min before each experiment. Filament 28 is maintained at 1700° C., and remains on during actual laser irradiation.

The processing procedure involves irradiating the nickel alloy disk with a cw carbon dioxide laser using a power density of $2 \times 10^4 W/cm^2$. This intensity is not only sufficient for rapid evaporation, but for complete beam penetration through the disk 24 at the focal spot. This results within 2 seconds in interaction with the underlying ceramic target 22 to produce a plume 30, containing predominantly silica species. Silica condenses from the plume, together with aluminum and tungsten. The source of aluminum is the nickel alloy disk; the source of the tungsten is chemical transport from the heated filament. A layer of composite material 32 is deposited on the cooler region of the nickel alloy disk 24. It was observed that aluminum deposition occurred for a short interaction time (2-3 s) while tungsten was deposited for a longer period (8-10 s). Microstructural examination using electron microscopy revealed that silica incorporated in deposited films 32 frequently existed in the form of fibers with dimensions in the 25-120 nm range. These fibers were also analyzed by Auger spectroscopy, Fourier transform infrared spectroscopy and by x-ray and electron difraction. In all cases the silica fibers were amorphous. Observation of fiber extraction replicas in the electron microscope was particularly valuable in studying the initial fiber growth and the development of randomly distributed fiber networds. The effect of increasing the interaction time between the laser and the ceramic clearly has shown that with the short interaction time of about 2 seconds, 25 nm diam fibers are seen to be forming by apparent coagulation of silica particles. However, a longer interaction time (about 7-8 seconds) results in well developed 100 nm diameter fibers, which form relatively dense networks. The rapidity of fiber growth is a particularly significant feature of this invention and it has been established that composite films can grow at rates of approximately 1 micron/s.

In the experiments, an important factor was found to be the position of the filament relative to the nickel alloy disk 24 (see FIG. 1). For example, with the filament 28 in close proximity (e.g. less than 1 cm spacing) to the disk 24, nanoscale silica particles no longer formed fibers but instead aggregated into large crystalline particles.

Figure 2:
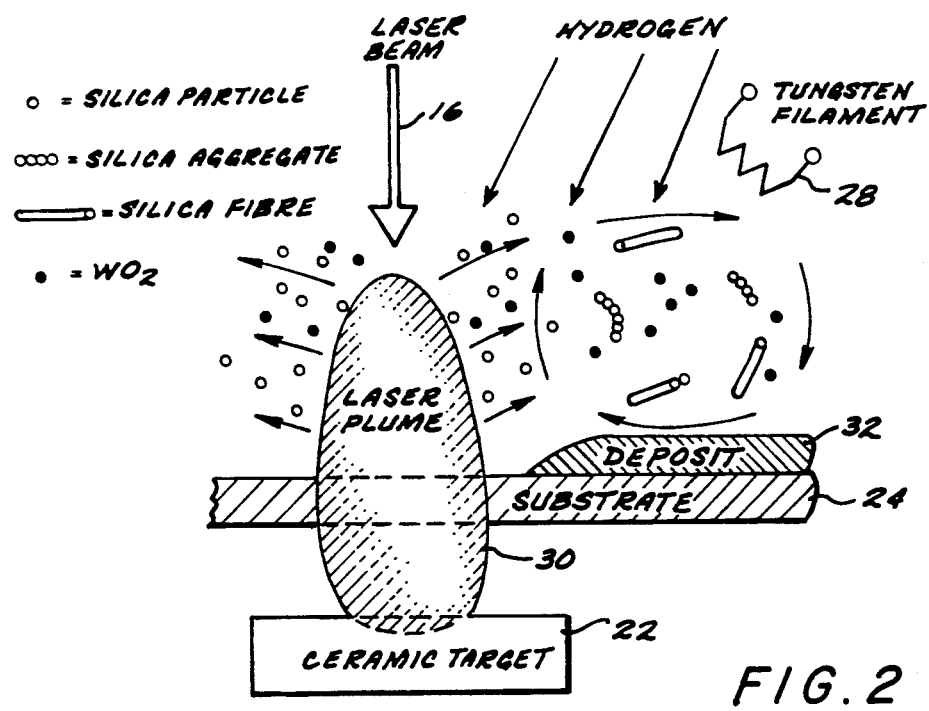
FIG. 2 is a diagrammatic view depicting a proposed synthesis mechanism used in the present invention.

Analysis of the above described synthesis has ruled out previously known reaction mechanisms such as the vapor liquid solid mechanism. Instead, and with reference to FIG. 2, on the basis of detailed electron microscope observations, and complimentary analytical methods, it has been hypothesized that silica fibers form by a particle agglomeration process (although other reaction mechanisms are possible). Direct evidence of this has been shown from reviewing micrographs which depict 25 nanometer amorphous silica fibers formed after a plume duration of 2 seconds. In this process, it has been determined that 5-10 nanometer silica particle condense from the plume. These particles undergo progressively increasingly coagulation as they are circulated in a convection current above the substrate so as to form an aggregate of silica particles. Continued development of fibers occurs for a larger plume duration of 10 seconds, when well developed fibers of 100 nm diameter form into random weave network structures. In completely reproducible tests, it has been shown that composite deposited layers form by:

(1) Capture of fibers at the substrate;
(2) Codeposition of either aluminum or tungsten.

Using x-ray diffraction data, it has been found that aluminum matrix composites form at short plume durations where aluminum vapor forms from the nickel aluminum substrate 24 in the laser interaction region. At longer reaction times (10 seconds), tungsten matrix composites form. Tungsten is derived from the heated filament 28 in a process involving chemical transport of tungsten oxide, with subsequent reduction to metallic tungsten.

As mentioned, x-ray diffraction data indicated that the as deposited films contained either tungsten (W) or aluminum (Al). Al was deposited from evaporation of Ni alloy when short laser beam/ceramic target interaction times were used for instance 1 sec. At the melting point of Ni alloy (about 1400° C.), the vapor pressures for Al, Cr, and Ni are approximately $10^{-1}$ torr, $10^{-2}$ torr and $10^{-3}$ torr, respectively. The higher vapor pressure of Al in the molten metal allowed Al to escape and condense on the cooler surrounding regions. Absence of noticeable Ni and Cr in the deposits may be explained by their longer time of stay in the molten pool due to their lower vapor pressures at the temperature concerned, thus allowing these species to be superheated. Atoms of these superheated vapors had too much kinetic energy and would not be able to condense on the Ni alloy substrate. W was not deposited for short laser beam/ceramic target interaction times. This is because of the insufficient concentration of water vapor available in the interaction zone to facilitate W transport. When longer laser beam/ceramic target interaction times were used (about 8-9 seconds), tungsten was deposited as a matrix. In this case, the underlying ceramic plume heated the Ni alloy substrate by blackbody radiation, and the temperature of the alloy was measured to be in the range of 1200° to 1300° C. At this temperature range, the corresponding vapor pressure of Al would be about $10^{-1}$ torr. Therefore the substrate was too hot for Al to condense on it. Simultaneous codeposition of a ceramic dispersed phase was observed in both Al and W matrices.

The source of tungsten was the heated W filament. Though the filament temperature was well below the temperature range for any significant W evaporation to occur, W was deposited on the Ni alloy substrate via a chemical vapor transport mechanism. In this process, the thermal evaporation of $SiO_2$ produced oxygen upon pyrolysis and the oxygen atoms reacted with hydrogen to form water vapor. The water vapor molecules reacted with the heated W filament to form volatile $WO_n$ species. These species were transported from the hot filament to the Ni alloy substrate and resulted in reformation of W on the substrate surface.

In addition to serving as a W source, the W filament played other roles. It was experimentally observed that the Ni alloy was heated by thermal radiation from the heated filament. Calculations showed that the temperature of the Ni alloy would be at 975° C. due to radiative heating of the filament. The measured temperature due to such heating was in the range of 200° to 300° C., indicating that the thermal loss due to hydrogen conduction was significant. The dissociation of molecular hydrogen to from atomic hydrogen at the filament was calculated to be only 0.23%. Therefore, it is clear that significant dissociation of molecular hydrogen would only occur when the high temperature, laser assisted reactions took place. It was also observed that the melt through time of the Ni alloy by the laser beam was less than 2 sec, when the heated tungsten filament was used. This melt through time was three times faster than that obtained when the filament was not used. FTIR data indicated that a thin film of carbon species was deposited by the dissociation of methane at the heated filament. This film possessed an absorption band that matched the wavelength of the laser beam. Since the Ni alloy has no absorption band in the infrared, the predeposition of this IR active film enhanced the beam metal coupling, resulting in a faster melt through time.

The ultrafine composite synthesis technique of the present invention represents a significant advance in the art since it provides a rapid method for producing a diversity of ultrafine fiber-reinforced composites. The preparation of aluminum and tungsten matrix materials demonstrates the viability to produce:

(1) high strength/low weight composite layers (2) high strength/high temperature composite layers.

In principle the method may be used to generate composites strengthened by various ceramic phases, such as silicon carbide, silicon nitride, etc. The present invention can also be used to generate fibers of complex phases, such as Sialon. The high deposition rates attainable using this invention makes the production of thick deposits and bulk material viable. Although the present specification is primarily concerned with fiber strengthening, tests have shown other morphological structures. This is achieved by varying the filament position and other operational parameters. Thus, in principle, the method of this invention can be used to generate thin and thick section materials with (1) fibrous, (2) particulate and (3) lamellar morphologies.

While tungsten filaments have been described, other metal filaments such as tungsten alloy, nickel, molybdenum, tatanlum and metal alloys may also be used. It will be appreciated that the use of these alternative filaments will provide a metal matrix composed of the alternative metal filament materials.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method for making a composite material, comprising:

irradiating a first portion of metallic substrate in a reducing environment within a reaction chamber with a laser beam at an intensity effective to evaporate material from the first portion of the substrate, said substrate comprising a first metal;

heating a metallic filament, comprising a second metal, in the reducing environment within the reaction chamber under conditions effective to allow chemical transport of the second metal from the filament to the substrate, said metallic filament being disposed above and spaced apart from the metallic substrate;

irradiating a ceramic target in the reducing environment within the reaction chamber with the laser beam at an intensity effective to evaporate material from the ceramic target and form a laser plume, said ceramic target being spaced apart from the substrate;

depositing a layer of the composite material on a second portion of the substrate, said composite material comprising ultrafine ceramic fibers distributed within a metallic matrix, said fibers being derived from the evaporated ceramic material of the laser plume and said metallic matrix being selected from the group consisting of the first metal derived from the substrate, the second metal derived from the filament and mixtures thereof, wherein said fibers have fiber diameters between 25 nm and 120 nm.

2. The method of claim 1, wherein the ceramic target and the ceramic fibers each comprise $SiO_2$, silicon nitride or silicon carbide.

3. The method of claim 1, wherein the ceramic target and the ceramic fibers each comprise silica.

4. The method of claim 1, wherein the ceramic target comprises 55 weight percent $SiO_2$, 42 weight percent $Al_2O_3$ and 3 weight percent $TiO_2$ and the ceramic fibers comprise silica fibers.

5. The method of claim 1, wherein the metallic filament is disposed about 2 cm from the substrate.

6. The method of claim 1, wherein the laser beam is generated by a $CO_2$ laser at an intensity of $2 \times 10^4$ $W/cm^2$.

7. The method of claim 1, wherein the substrate is disposed between the laser source and the ceramic target, substrate is heated by irradiating a first portion of the substrate with the laser beam for a time period effective to perforate the first portion of the substrate by evaporating material from the substrate, wherein the composite material is deposited on a second portion of the substrate by simultaneous deposition of the ceramic fibers, said fibers being formed by coagulation and condensation of material evaporated from the ceramic target, and of the metallic matrix, said matrix being formed by condensation of material evaporated from the substrate.

8. The method of claim 7, wherein the substrate comprises an alloy of nickel, aluminum and chromium and wherein the first metal comprises aluminum.

9. The method of claim 7, wherein the substrate is perforated by exposure to a $CO_2$ laser at an intensity of $2 \times 10^4$ W/cm$^2$ for a time period of 2-3 seconds.

10. The method of claim 9, wherein the ceramic fibers comprises fibers having a diameter of 25 nm.

11. The method of claim 1, wherein substrate is heated to a temperature between 1200° C. and 1300° C., the metallic filament comprises a tungsten filament, the ceramic target comprises silica, the reducing environment comprises hydrogen gas and the metallic matrix of the layer of composite material comprises tungsten.

12. The method of claim 1, wherein tungsten and said ceramic fibers are simultaneously deposited on said substrate by coagulation and condensation of material evaporated from the ceramic target and by chemical vapor deposition of tungsten from the heated filament.

13. The method of claim 12, wherein the ceramic target is irradiated for a time period of 8-9 seconds.

14. The method of claim 13, wherein the fibers comprise silica fibers having a diameter of 100 nm.

15. A method for making a fiber reinforced metallic matrix composite material, comprising:
   irradiating a ceramic target in a reducing environment with a $CO_2$ laser beam at an intensity effective to form a laser plume of material evaporated from the ceramic target;
   subjecting the material evaporated from the target to a convective current effective to allow coagulation of evaporated material to form ceramic fibers, said fibers having diameters between 25 nm and 120 nm; and
   depositing the ceramic fibers on a substrate while simultaneously depositing a metal matrix material on the substrate to form the composite material wherein the matrix material is deposited by condensation of evaporated matrix material or by chemical transport of matrix material.

16. The method of claim 15, wherein the ceramic target and the ceramic fibers each comprise silica, silicon nitride or silicon carbide.

17. The method of claim 15, wherein said convective current is generated between the substrate and a heated metallic filament disposed above and spaced apart from the substrate.

18. The method of claim 15, wherein the matrix material comprises aluminum or tungsten.

* * * * *